(12) United States Patent
Chen

(10) Patent No.: US 6,788,531 B2
(45) Date of Patent: Sep. 7, 2004

(54) PANEL MOUNTING APPARATUS

(75) Inventor: Li Ping Chen, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 79 days.

(21) Appl. No.: 10/309,487

(22) Filed: Dec. 3, 2002

(65) Prior Publication Data

US 2004/0032713 A1 Feb. 19, 2004

(30) Foreign Application Priority Data

Aug. 13, 2002 (TW) ...................................... 91212544 U

(51) Int. Cl.[7] ................................................. G06F 1/16
(52) U.S. Cl. ....................... 361/683; 361/679; 361/684; 211/26; 312/265.6
(58) Field of Search ................................. 361/683–686, 361/724–727, 759, 788, 801–816; 211/26, 182, 189, 41.17; 312/265.1, 265.2, 265.3, 265.4, 265.6, 223.2; 403/384, 397

(56) References Cited

U.S. PATENT DOCUMENTS

| | | | | |
|---|---|---|---|---|
| 5,281,022 A | * | 1/1994 | Rock | 312/348.4 |
| 5,423,605 A | * | 6/1995 | Liu | 312/265.6 |
| 6,282,085 B1 | * | 8/2001 | Chao et al. | 361/683 |
| 6,442,020 B1 | * | 8/2002 | Liu et al. | 361/683 |
| 6,683,785 B1 | * | 1/2004 | Chen | 361/685 |
| 6,695,149 B1 | * | 2/2004 | Cote et al. | 211/26 |

* cited by examiner

Primary Examiner—Michael Datskovsky
(74) Attorney, Agent, or Firm—Wei Te Chung

(57) ABSTRACT

A panel mounting apparatus includes a chassis (10) and a panel (20). The chassis includes a front wall (11) defining two symmetrical arcuate slots (15). Two cutouts (17) are defined in the front wall at ends of the slots respectively. Two through holes (19) are defined in the front wall adjacent the slots respectively. The panel includes two posts (21) and two pins (25), respectively corresponding to the slots and the through holes of the front wall. Each post comprises a hook (23) at an end thereof. The posts are extended through the cutouts. The panel is then rotated so that the posts slide along the slots. The pins snappingly engage in the through holes of the front wall, and the hooks of the posts engage with the front wall at ends of the slots. The panel is thereby securely mounted to the front wall of the chassis.

15 Claims, 3 Drawing Sheets

PANEL MOUNTING APPARATUS

BACKGROUND OF THE INVENTION

1. Field of the Invention

The present invention relates to an electrical device, and more particularly to an apparatus for mounting a panel to a chassis of the electrical device.

2. Related Art

An electrical device, such as a computer or a data storage device, typically includes a chassis made of a metallic material. To provide an aesthetically pleasing appearance and for a variety of functional purposes, various plastic panels are used to cover portions of the chassis.

The panel is usually fastened to the chassis with a plurality of screws. This requires a fastening tool such as a screwdriver. This is inconvenient and time-consuming, and particularly costly in mass production facilities. Another conventional way to attach the panel to the chassis involves heating a portion of the panel and the chassis, and then pressing the hot panel and chassis together. After cooling down, the panel is fixed to the chassis. However, the panel is not detachable from the chassis. When either the panel or the chassis requires replacement, the whole combination has to be replaced. This wastes money and resources.

In order to overcome the above-mentioned problems, some panels are mounted with special panel mounting apparatuses. One such apparatus utilizes a sliding panel configuration. However, the ease by which the panel can be removed and reinstalled is adversely affected by interference between the panel and its corresponding chassis. Other panel mounting apparatuses utilize a detachable clip configuration that allows the panel to be unhooked and then removed from the chassis. However the detachable clips are prone to break, and the panel requires precise alignment before it is reinstalled on the chassis.

Therefore, an improved panel mounting apparatus which overcomes the above-mentioned problems is desired.

SUMMARY OF THE INVENTION

Accordingly, an object of the present invention is to provide an apparatus for readily and conveniently installing and removing a panel onto and from a chassis of an electrical device.

To achieve the above-mentioned object, a panel mounting apparatus in accordance with a preferred embodiment of the present invention comprises a chassis and a panel. The chassis comprises a front wall. A pair of generally symmetrical arcuate slots is respectively defined in the front wall at opposite sides of a symcenter that is at a middle of the front wall. A cutout is defined in the front wall at an end of each slot. A pair of through holes is defined in the front wall more distant from the symcenter than the slots respectively. The panel comprises a pair of posts and a pair of pins projecting from a main face thereof, respectively corresponding to the slots and the through holes of the front wall. Each post comprises a hook at an end thereof. The posts are extended through the cutouts. The panel is then rotated so that the posts slide along the slots. The pins snappingly engage in the through holes of the front wall, and the hooks of the posts engage with the front wall at ends of the slots. The panel is thereby securely mounted to the front wall of the chassis.

Other objects, advantages and novel features of the present invention will be drawn from the following detailed description of a preferred embodiment of the present invention with attached drawings, in which:

DESCRIPTION OF THE PREFERRED EMBODIMENT

Figure 1:
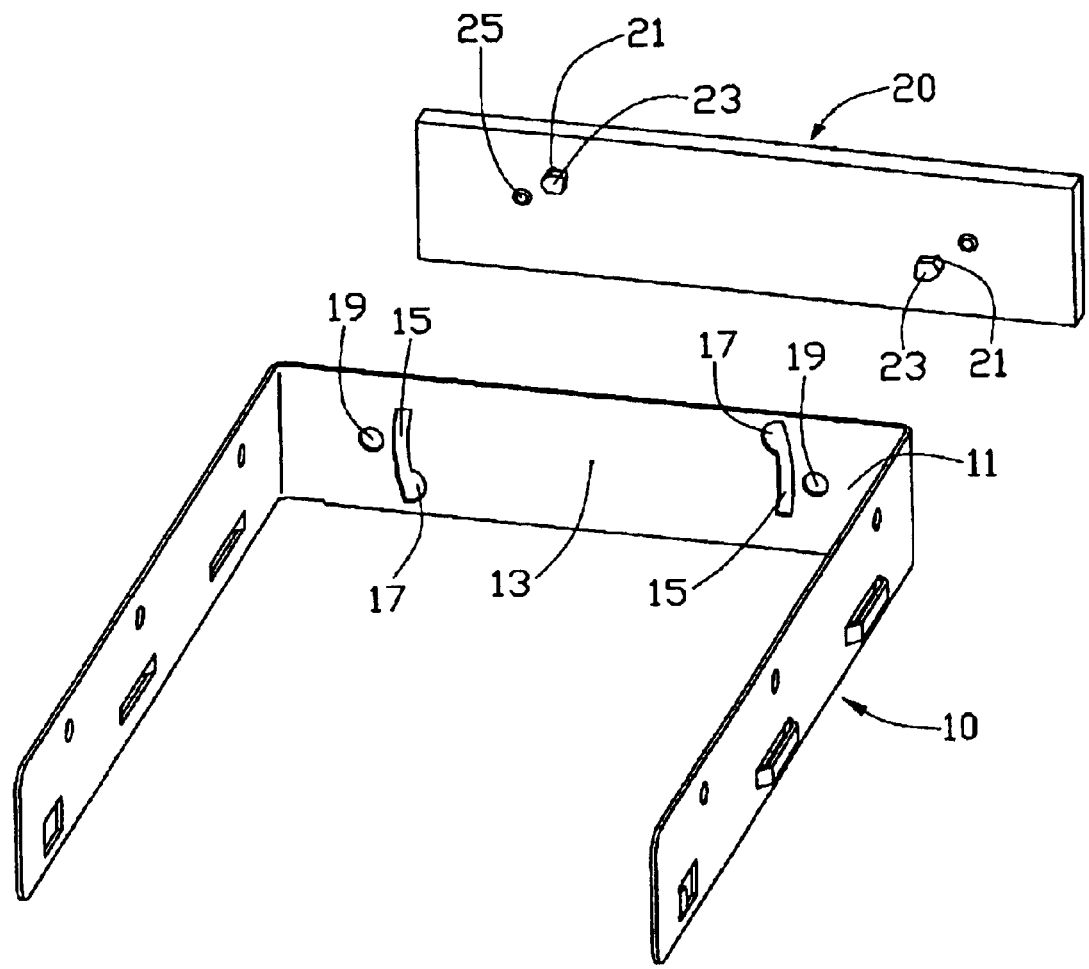
FIG. 1 is an exploded isometric view of a panel mounting apparatus in accordance with the preferred embodiment of the present invention.

Referring to FIG. 1, a panel mounting apparatus in accordance with a preferred embodiment of the present invention includes a chassis 10 for receiving an electrical device (not shown), and a panel 20 for attaching to the chassis 10.

The chassis 10 includes a front wall 11. The front wall 11 defines a pair of generally symmetrical arcuate slots 15 at opposite sides of a symcenter 13 respectively, the symcenter 13 being at a middle of the front wall 11. A cutout 17 is defined in the front wall 11 at an end of each slot 15. The cutouts 17 are diagonally opposite each other across the symcenter 13. A pair of through holes 19 is defined in the front wall 11 adjacent the slots 15 respectively. In the preferred embodiment, the through holes 19 are more distant from the symcenter 13 than the slots 15.

The panel 20 includes a pair of posts 21 and a pair of pins 25 projecting from a main face thereof, respectively corresponding to the slots 15 and the through holes 19 of the chassis 10. Also referring to FIG. 4, each post 21 includes a hook 23 at an end thereof.

Figure 2:
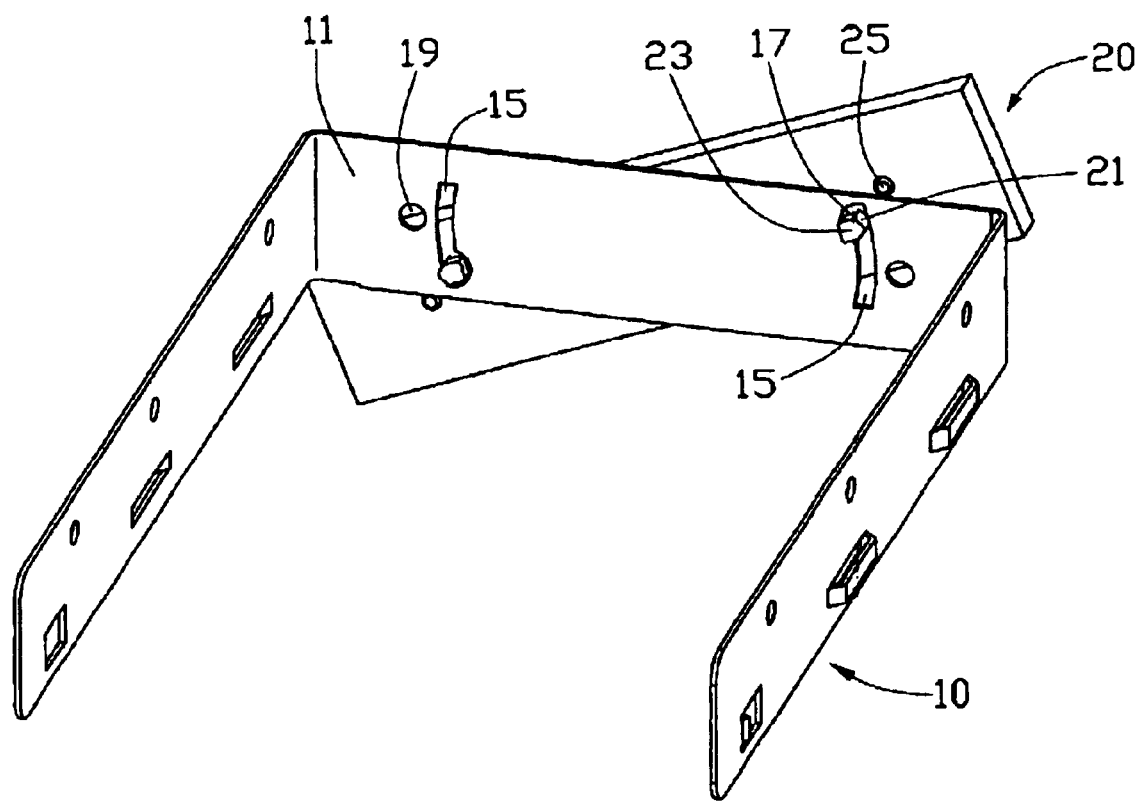
FIG. 2 is a partly assembled view of FIG. 1.
Figure 3:
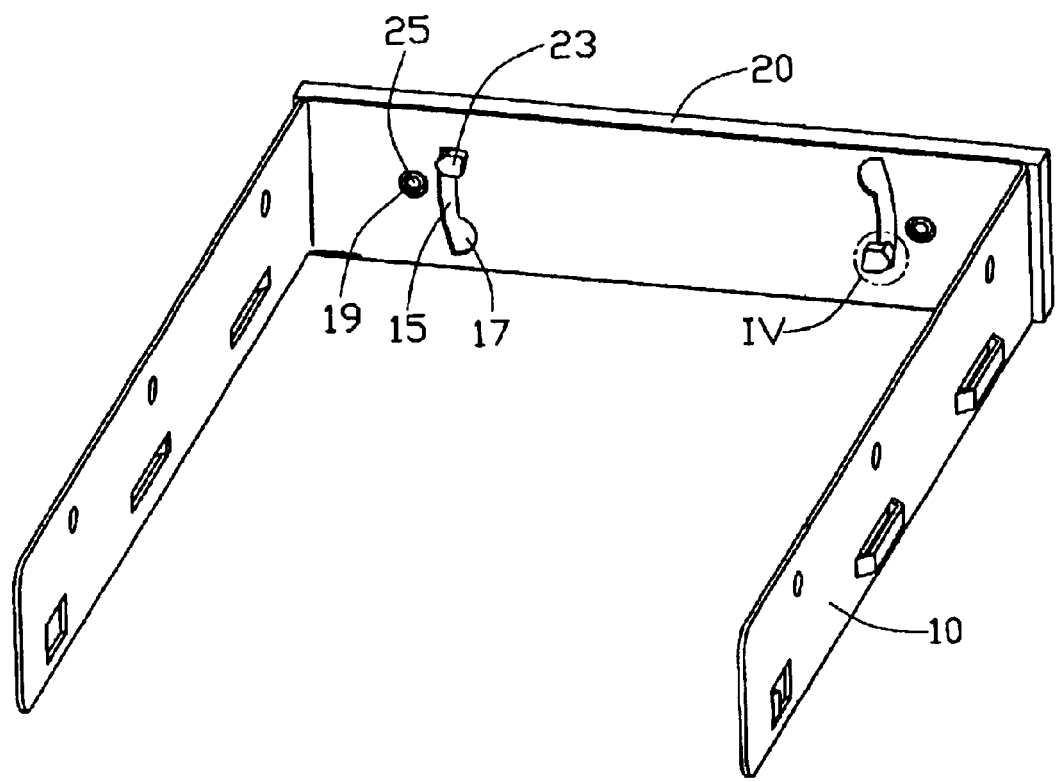
FIG. 3 is a fully assembled view of FIG. 2.
Figure 4:
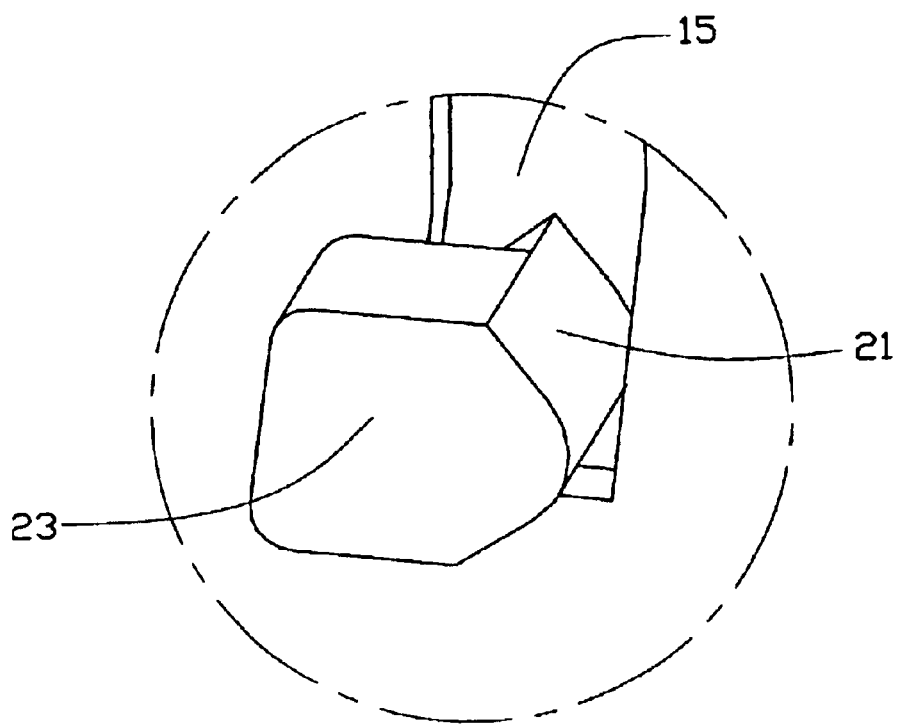
FIG. 4 is an enlarged view of an encircled portion IV of FIG. 3.

Referring to FIGS. 2–4, in assembly, the panel 20 is positioned adjacent an outer face of the front wall 11 of the chassis 10. The posts 21 of the panel 20 are extended through the cutouts 17 of the front wall 11, with the hooks 23 of the posts 21 projecting beyond an inner face of the front wall 11. The panel 20 is rotated so that the posts 21 slide along the slots 17. During such rotation, the projections 25 of the panel 20 press against the front wall 11. As a result, the panel 20 deforms slightly. When the posts 21 reach ends of the slots 15, the projections 25 of the panel 20 are snappingly received in the corresponding through holes 19 of the front wall 11. The panel 20 thus resiliently returns to its original shape, and the hooks 23 of the posts 21 engage with the front wall 11 at the ends of the slots 15. The panel 20 is thereby securely attached to the chassis 10.

In disassembly, the panel 20 is deformed so that the projections 25 of the panel 20 substantially disengage from the through holes 19 of the front wall 11. The panel 20 is rotated so that the posts 21 slide along the slots 15. When the posts 21 reach the cutouts 17, the panel 20 resiliently returns to its original shape and is easily removed from the front wall 11.

In the panel mounting apparatus of the present invention, the projections 25 of the panel 20 engage in the corresponding through holes 19 of the front wall 11 of the chassis 10. Thus, the panel 20 is prevented from moving relative to the chassis 10 in a first direction and a second direction that is perpendicular to the first direction, the first and second directions both being parallel to the front wall 11. In addition, the hooks 23 of the panel 20 engage with the front wall 11 at the slots 17. Thus, the panel 20 is prevented from moving relative to the chassis 10 in a third direction that is perpendicular to both the first and second directions.

Furthermore, during assembly and disassembly, it is the panel 20 that undergoes deformation rather than the posts 21 or the projections 25. The panel 20 typically has great mechanical strength and resiliency. Therefore, risk of fatigue and breakage of the panel mounting apparatus of the present invention is minimized.

Moreover, to remove the panel 20 from the chassis 10, the panel 20 must be deformed and rotated relative to the, front wall 11. Even if the panel 20 is subjected to vibration or shock during use, such conditions are unlikely to result in accidental detachment of the panel 20 from the front wall 11. Therefore, the mounting apparatus of the present invention provides highly reliable attachment of the panel 20 to the chassis 10.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A panel mounting apparatus comprising:
   a chassis adapted for receiving an electrical device therein, and comprising at least one wall, the at least one wall defining a pair of slots and cutouts in communication with corresponding slots, and at least one hole; and
   a panel comprising a pair of first projections corresponding to the slots, and at least one second projection corresponding to the at least one hole, each of the first projections comprising a hook;
   wherein the first projections extend through the cutouts of the front wall, the hooks of the first projections engage with the front wall at the slots respectively, and the at least one second projection engages in the at least one hole of the front wall whereby the panel is attached to the at least one wall of the chassis.

2. The panel mounting apparatus as described in claim 1, wherein the slots are generally arcuate and symmetrically defined in the front wall at opposite sides of a symcenter respectively, the symcenter being at a middle of the front wall.

3. The panel mounting apparatus as described in claim 2, wherein the cutouts are defined in the front wall at ends of the slots and diagonally opposite each other across the symcenter.

4. The panel mounting apparatus as described in claim 1, wherein the at least one hole is defined adjacent at least one of the slots and more distant from the symcenter than the slots.

5. A panel mounting apparatus comprising:
   a chassis adapted for receiving an electrical device therein, and comprising at least one wall, the at least one wall defining a pair of slots and at least one hole, the slots each having a first location and a second location dimensionally dimensionally configured different from each other; and
   a panel comprising a pair of first projections corresponding to the slots, and at least one second projection corresponding to the at least one hole;
   wherein the first projections are slidable in the slots between the first location in which the first and second projections are in a released state and the second location in which the first and second projections are in an engaged state.

6. The panel mounting apparatus as described in claim 5, wherein the slots are generally arcuate and symmetrically defined in the front wall at opposite sides of a symcenter respectively, the symcenter being at a middle of the front wall.

7. The panel mounting apparatus as described in claim 6, wherein a pair of cutouts is defined in the front wall at the first locations of the slots respectively, the cutouts being diagonally opposite each other across the symcenter.

8. The panel mounting apparatus as described in claim 7, wherein the at least one hole is defined adjacent at least one of the slots and more distant from the symcenter than the slots.

9. The panel mounting apparatus as described in claim 8, wherein each of the first projections comprises a hook at an end thereof, the hooks engaging with the front wall at the slots respectively and the at least one second projection engaging in the at least one hole when the first projections reach the second locations of the slots, whereby the panel is attached to the front wall of the chassis.

10. The panel mounting apparatus as described in claim 5, wherein in the engaged state, the first projections restrain the panel from moving, relative to the wall, in a direction perpendicular to said wall while the second projection restrains the panel from moving, relative to the wall, on the wall in other directions perpendicular to said direction.

11. The panel mounting apparatus as described in claim 5, wherein said slots are configured to allow the panel to be rotatably assembled to the wall.

12. A method of mounting a panel to a chassis, comprising the steps of:
   providing a chassis comprising at least one wall, the at least one wall defining a pair of slots and at least one hole, each of the slots having a first end and a second end;
   providing a panel comprising a pair of first projections and at least one second projection;
   inserting the first projections into the first ends of the slots; and
   rotating the panel so that the first projections slide from the first ends to the second ends and the at least one second projection engages in the at least one hole of the chassis.

13. The method as described in claim 12, wherein the slots are generally arcuate and symmetrically defined in the front wall at opposite sides of a symcenter respectively, the symcenter being at a middle of the front wall.

14. The method as described in claim 13, wherein a pair of cutouts is defined in the front wall at the first ends of the slots respectively, the cutouts being diagonally opposite each other across the symcenter.

15. The method as described in claim 14, wherein each of the first projections comprises a hook at an end thereof, the hooks engaging with the front wall at the slots respectively and the at least one second projection engaging in the at least one hole when the first projections reach the second ends of the slots, whereby the panel is attached to the front wall of the chassis.

* * * * *